(12) United States Patent
Wu et al.

(10) Patent No.: US 8,980,704 B1
(45) Date of Patent: Mar. 17, 2015

(54) MANUFACTURING METHOD OF THIN FILM TRANSISTOR AND DISPLAY ARRAY SUBSTRATE USING SAME

(71) Applicant: Ye Xin Technology Consulting Co., Ltd., Hsinchu (TW)

(72) Inventors: I-Wei Wu, Hsinchu (TW); I-Min Lu, Hsinchu (TW); Wei-Chih Chang, Hsinchu (TW); Hui-Chu Lin, Hsinchu (TW); Yi-Chun Kao, Hsinchu (TW); Kuo-Lung Fang, Hsinchu (TW)

(73) Assignee: Ye Xin Technology Consulting Co., Ltd., Hsinchu (TW)

( * ) Notice: Subject to any disclaimer, the term of this patent is extended or adjusted under 35 U.S.C. 154(b) by 0 days.

(21) Appl. No.: 14/467,509

(22) Filed: Aug. 25, 2014

(30) Foreign Application Priority Data

Aug. 23, 2013 (TW) .............................. 102130378 A

(51) Int. Cl.
*H01L 21/84* (2006.01)
*H01L 27/12* (2006.01)
*H01L 29/66* (2006.01)
*H01L 21/308* (2006.01)
*H01L 21/3065* (2006.01)

(52) U.S. Cl.
CPC ...... *H01L 27/1288* (2013.01); *H01L 29/66765* (2013.01); *H01L 21/3081* (2013.01); *H01L 21/3065* (2013.01)
USPC .......................................... 438/158; 438/160

(58) Field of Classification Search
USPC .................................................. 438/151–166
See application file for complete search history.

(56) References Cited

U.S. PATENT DOCUMENTS

| 5,348,897 | A | * | 9/1994 | Yen ................................ 438/152 |
| 5,963,797 | A | * | 10/1999 | Hyun ............................. 438/149 |
| 6,511,869 | B2 | * | 1/2003 | Colgan et al. ................. 438/149 |

* cited by examiner

*Primary Examiner* — Richard Booth
(74) *Attorney, Agent, or Firm* — Novak Druce Connolly Bove + Quigg LLP

(57) ABSTRACT

A manufacturing method of a thin film transistor includes hard-baking and etching processes for a stop layer. Two through holes are exposed and developed in a photoresistor layer, in which a distance between the two through holes is substantially equal to the channel length of the thin film transistor. Further, the etching stop layer is dry-etched to obtain the thin film transistor having an expected channel length.

20 Claims, 18 Drawing Sheets

MANUFACTURING METHOD OF THIN FILM TRANSISTOR AND DISPLAY ARRAY SUBSTRATE USING SAME

CROSS-REFERENCE TO RELATED APPLICATIONS

This application claims priority to Taiwanese Patent Application No. 102130378 filed on Aug. 23, 2013 in the Taiwan Intellectual Property Office, the contents of which are incorporated by reference herein.

FIELD

The disclosure generally relates to thin film transistor manufacture.

BACKGROUND

A channel layer of a thin film transistor can be made of metal oxide semiconductor. An etching stop layer can be arranged on the channel layer to protect the metal oxide semiconductor. A thickness of the etching stop layer is generally greater than 100 nanometers. However, in etching stop (ES) process a resolution of exposing a through hole in the etching stop layer is not high enough to achieve a shorter channel length between a source electrode and a drain electrode of the thin film transistor.

BRIEF DESCRIPTION OF THE DRAWINGS

Implementations of the present technology will now be described, by way of example only, with reference to the attached figures.

DETAILED DESCRIPTION

Figure 1:
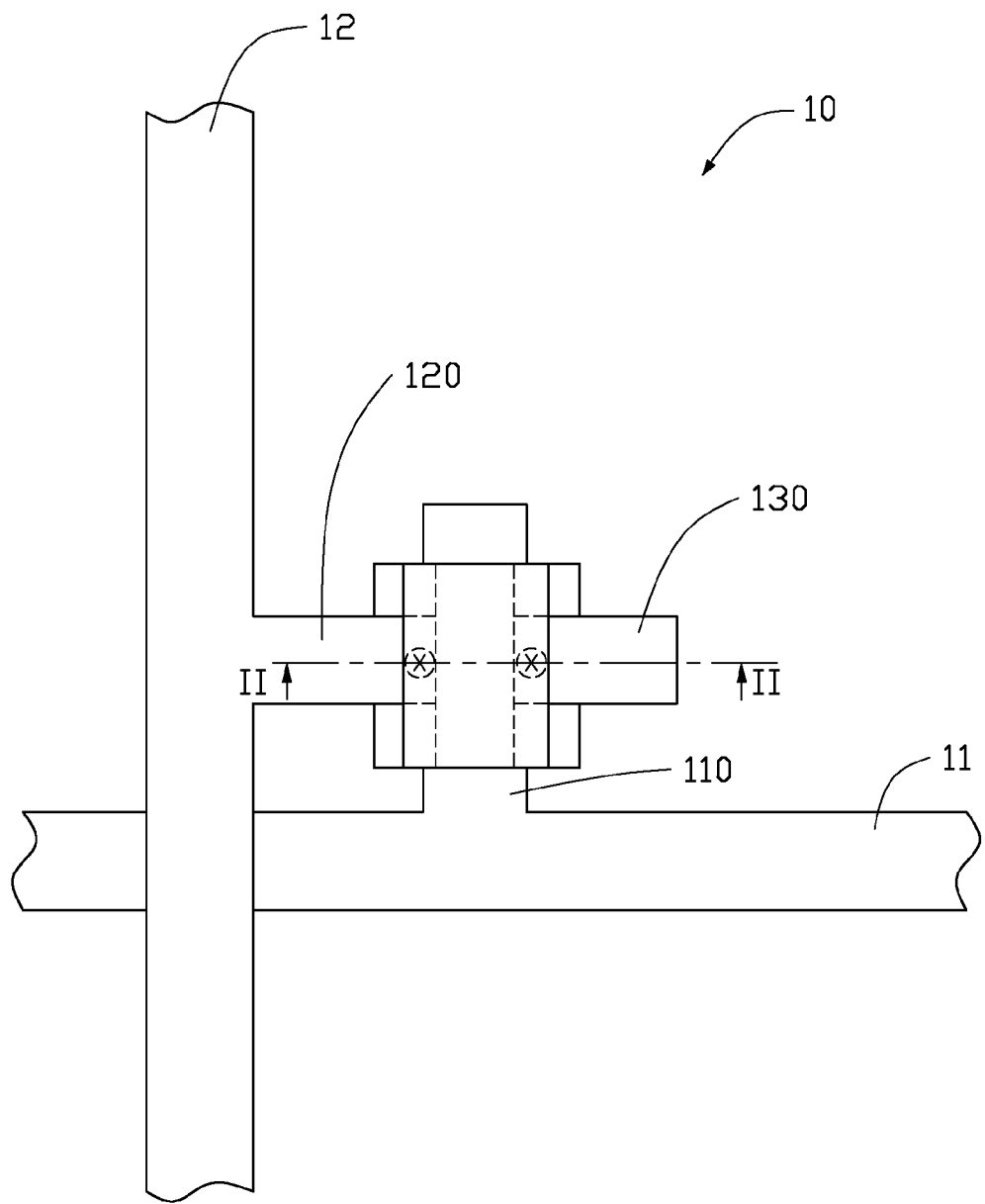
FIG. 1 is a partially sectioned isometric view of a pixel electrode of a display array substrate with thin film transistors according the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Referring to FIG. 1, a display array substrate 10 can include a plurality of gate lines 11 and a plurality of data lines 12. The gate lines 11 are parallel to each other. The data lines 12 are parallel to each other, and each independently intersects with the gate lines 11. The data lines 12 and the gate lines 11 define multiple intersections where the data lines 12 cross the gate lines 11. A thin film transistor (TFT) 100 is arranged on each of the multiple intersections. The thin film transistor 100 can include a gate electrode 110, a source electrode 120, and a drain electrode 130. The gate electrode 110 is electrically connected to one gate line 11 to receive a gate signal which is output by a gate driver (not shown). The source electrode 120 is electrically connected to one data line 12 to receive a data signal which is output by a data driver (not shown).

Figure 2:
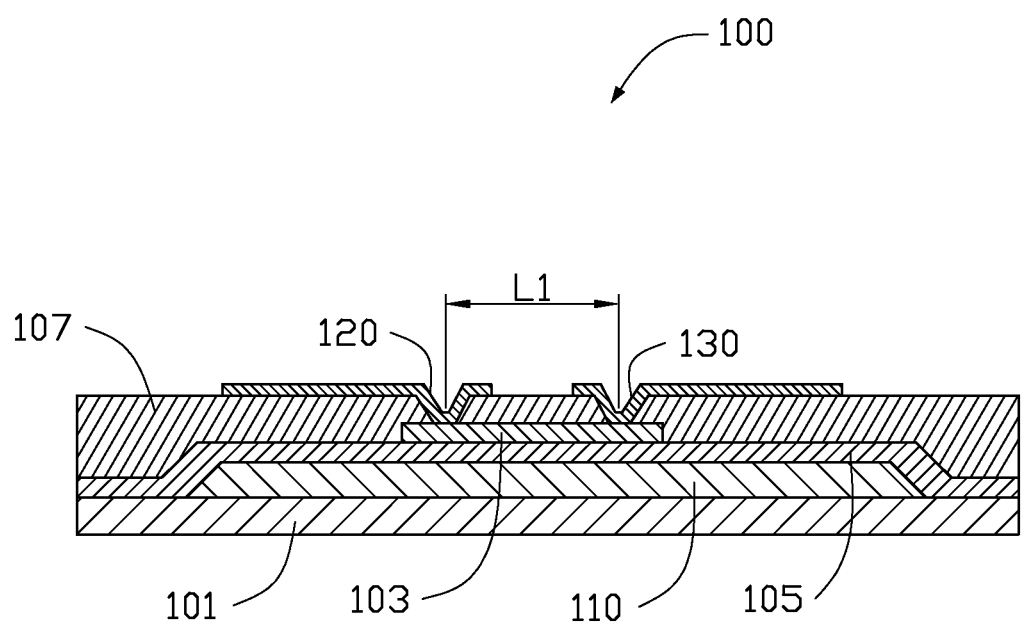
FIG. 2 is a sectional view of the thin film transistor of FIG. 1 according to a first embodiment.

When a potential of the gate signal is greater than a threshold potential of the thin film transistor 100, a channel layer 103 (as shown in FIG. 2) is turned on, thus the data signal is output to the drain electrode 130 via the source electrode 120.

Referring also to FIG. 2, the thin film transistor 100 can further include a gate insulating layer 105 and an etching stop layer 107. The gate electrode 110 is formed on a substrate 101. The source electrode 120 and the drain electrode 130 are arranged on the same layer. The channel layer 103 is coupled between the source electrode 120 and the drain electrode 130. The gate insulating layer 105 is formed on the same substrate 101 on which the gate electrode 110 is formed, and electrically insulates the gate electrode 110 from the channel layer 103. The etching stop layer 107 is arranged on a surface of the channel layer 103 to protect the channel layer 103.

FIGS. 3-8 show sectional views illustrating a manufacturing method of the thin film transistor 100. FIG. 9 shows a flowchart of the manufacturing method of the thin film transistor 100.

Figure 3:
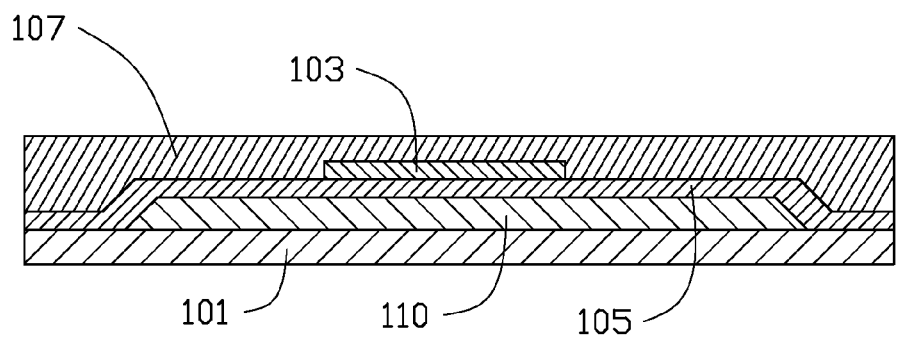
FIGS. 3-8 are sectional views illustrating a manufacturing method of the thin film transistor of FIG. 2.

At block 301, as shown in FIG. 3, the gate electrode 110 and the gate insulating layer 105 are formed on the substrate 101. In detail, a first metal layer is deposited on the substrate 101, and then the first metal layer is patterned to form the gate electrode 110. The gate insulating layer 105 is coated on the gate electrode 110. In the embodiment, the first metal layer is etched by photo lithography process. The substrate 101 can be a glass substrate or a quartz substrate. The first metal layer can include molybdenum (Mo), aluminum (Al), chromium (Cr), copper (Cu), or neodymium (Nd). The gate insulating layer 105 can include silicon nitride (SiNx) or Silicon oxide (SiOx). In the embodiment, the gate insulating layer 105 can formed by sputtering, vacuum evaporation, pulsed laser deposition (PLD), or Plasma Enhanced CVD (PECVD) methods.

Referring also to FIG. 3, at block 303, the channel layer 103 is formed on the gate insulating layer 105 to correspond to the gate electrode 110, and the etching stop layer 107 is coated on the channel layer 103. The channel layer 103 can be metal oxide semiconductor, such as indium gallium zinc oxide (IGZO), zinc oxide (ZnO), indium oxide (InO), gallium oxide (GaO), or the like. In the embodiment, a metal oxide semiconductor layer is formed on the gate insulating layer 105 by sputtering, vacuum evaporation, pulsed laser deposition (PLD), or Plasma Enhanced CVD (PECVD) method, and then the metal semiconductor layer is patterned to form the channel layer 103. A material of the etching stop layer 107 is organic and transparent. In the embodiment, the etching stop layer 107 is photo-active compound (PAC), and a photosensitivity of the etching stop layer 107 is not better than a photosensitivity of a photoresistor. The etching stop layer 103 protects the channel layer 103 against damage in subsequent processing, and a thickness of the etching stop layer 107 is generally greater than 100 nanometers up to a few micormeter.

At block 305, the etching stop layer 107 is hard-baked to become flat and solid. The hard-baking process of the etching stop layer 107 enhances adhesion between the etching stop layer 107 and the channel layer 103. In the embodiment, the etching stop layer 107 is hard-baked under a temperature between 100° C.-400° C. Residual organic solvents of the etching stop layer 107 are evaporated in the hard-baking, thus the etching stop layer 107 becomes solid and the adhesion between the etching stop layer and the channel layer 103 is enhanced.

Figure 4:
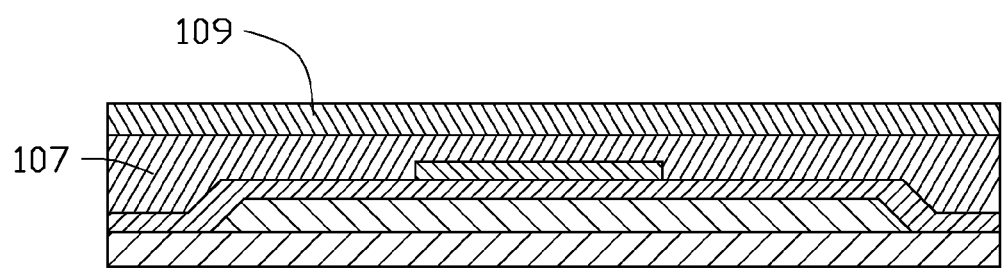

At block 307, referring to FIG. 4, a photoresistor layer 109 is coated on the etching stop layer 107.

Figure 5:
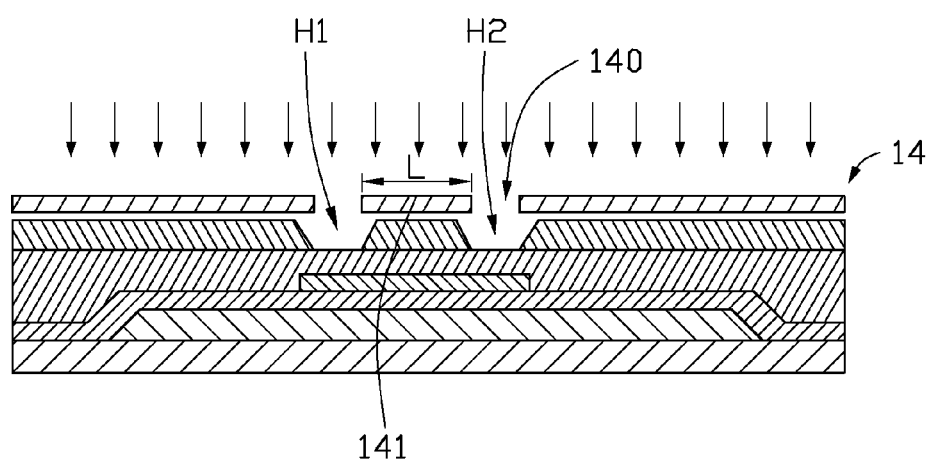

At block 309, referring to FIG. 5, the photoresistor layer 109 is patterned and two through holes, H1 and H2, are defined on the patterned photoresistor layer 109. In detail, the photoresistor layer 109 is photo-exposed and developed to define the two through holes H1 and H2, under a shield of a photomask 14. A distance between the two through holes H1 and H2 is equal to a predetermined channel length. In the embodiment, the distance between the two through holes H1 and H2 is 3-5 micrometers. The photomask 14 can include two transmission portions 140 and a shading portion 141. A distance between the two transmission portions 140 is defined to be the distance between the two through holes H1 and H2.

Figure 6:
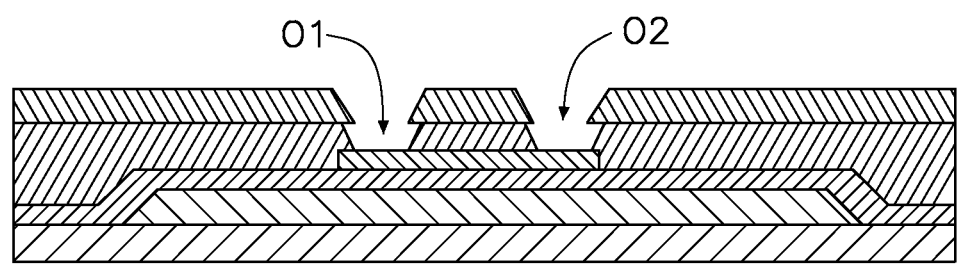

At block 311, referring to FIG. 6, two contact holes, O1 and O2, are formed by etching the etching stop layer 107 to the channel layer 103 using the patterned photoresistor layer 109 as a mask. The two contact holes O1 and O2 respectively contact the two through holes H1 and H2. In the embodiment, the etching stop layer 107 is etched by a dry-etching method, such as a plasma etching method or a reactive ion etching (RIE) method. A distance between the two contact holes O1 and O2 is substantially equal to the channel length L1.

Figure 7:
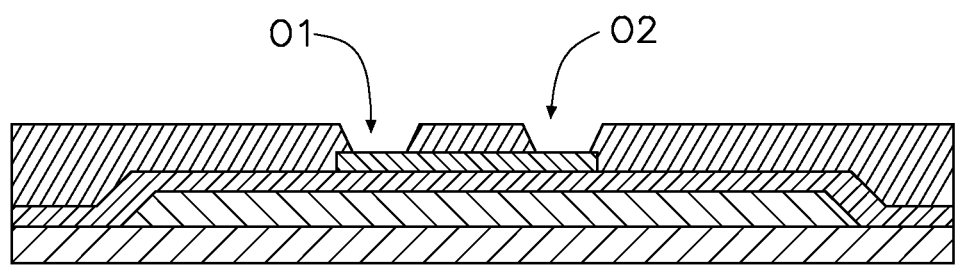

At block 313, referring to FIG. 7, residual photoresistor layer 109 is stripped away.

Figure 8:
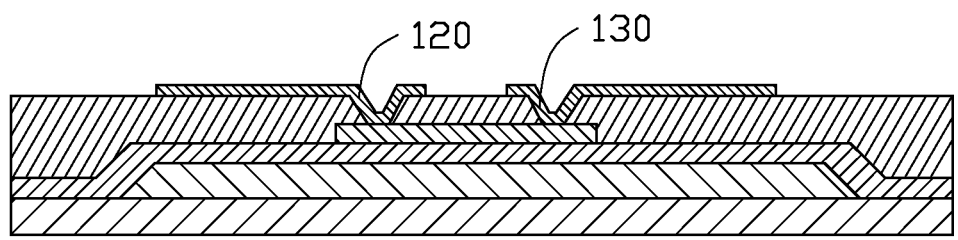
Figure 9:
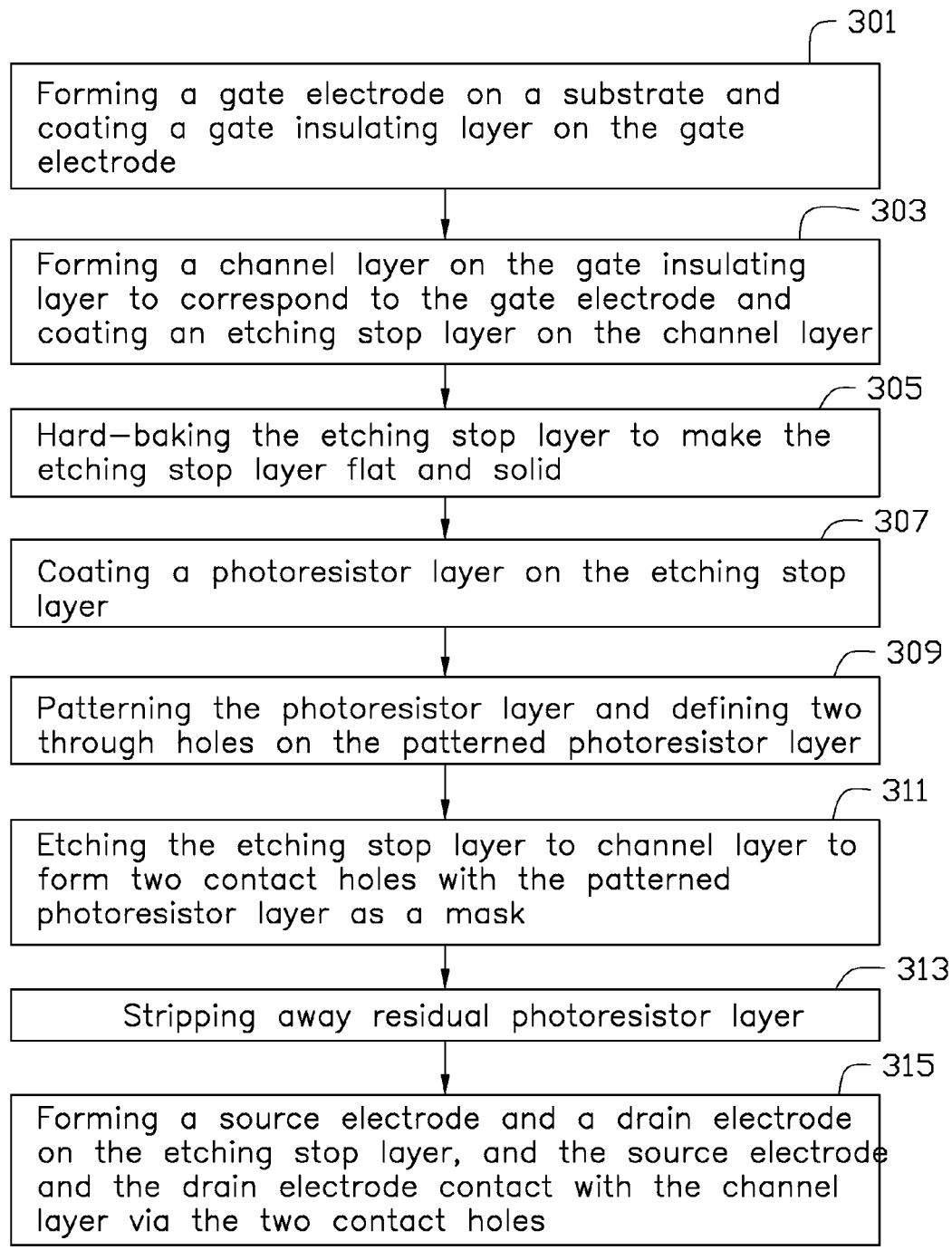
FIG. 9 is a flowchart of the manufacturing method of the thin film transistor of FIG. 2.

At block 315, referring to FIG. 8, the source electrode 120 and the drain electrode 130 are formed on the etching stop layer 107. The source electrode 120 and the drain electrode 130 respectively infill the two contact holes O1 and O2 to contact the channel layer 103. In detail, a second metal layer is deposited on the etching stop layer 107, and then the source electrode 120 and the drain electrode 130 are formed in a mask process by patterning the second metal layer. The first metal layer can include molybdenum (Mo), aluminum (Al), chromium (Cr), copper (Cu), or neodymium (Nd).

Figure 10:
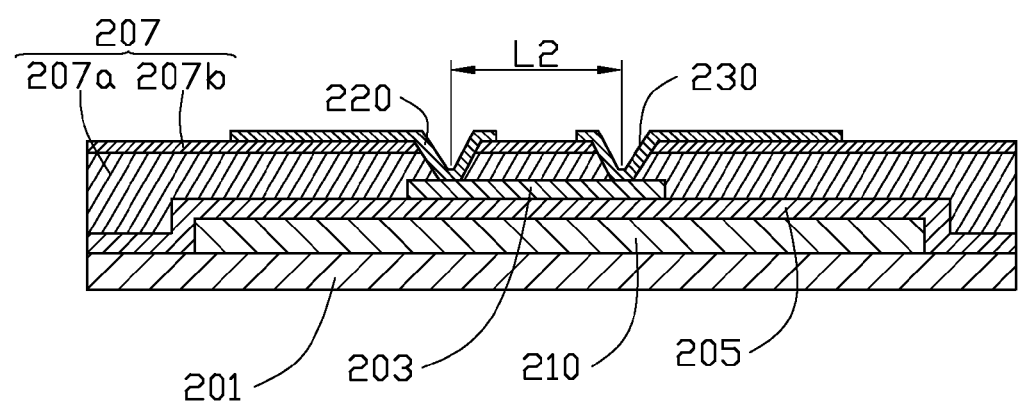
FIG. 10 is a sectional view of the thin film transistor of FIG. 1 according to a second embodiment.

FIG. 10 shows a thin film transistor (thin film transistor 200) according to a second embodiment. The thin film transistor 200 can include a gate electrode 210, a channel layer 203, and a gate insulating layer 210. The gate electrode 210 is formed on a substrate 201. The channel layer 203 is arranged on the gate insulating layer 210 to correspond to the gate electrode 210. The thin film transistor 200 can further include an etching stop layer 207 protectively covering the channel layer 203. In one embodiment, the etching stop layer 207 can include an organic stop layer 207a and a hard mask layer 207b. The hard mask layer 207b is stacked up on the organic stop layer 207a. The organic stop layer 207a can be a transparent organic material layer after a curing process. The hard mask layer 207 is arranged on a surface of the organic stop layer 207a opposite to the substrate 201 to enhance a hardness of the organic stop layer 207a. In the embodiment, a thickness of the hard mask layer 207b is less than a thickness of the organic stop layer 207a. Two contact holes O21 and O22 penetrate the etching stop layer 207 to expose the channel layer 207. A distance between the two contact holes O21 and O22 defines a channel length L2. In the embodiment, the distance between the two contact holes O21 and O22 is less than ten micrometers. The preferred distance between the two contact holes O21 and O22 is 3-5 micrometers.

The thin film transistor 200 can further include a source electrode 220 and a drain electrode 230. The channel layer 203 is coupled between the source electrode 220 and the drain electrode 230. The source electrode 220 and the drain electrode 230 make contact with the channel layer 203 via the two contact holes O21 and O22.

FIGS. 11-17 show sectional views illustrating a manufacturing method of the thin film transistor 200. FIG. 18 shows a flowchart of the manufacturing method of the thin film transistor 200.

Figure 11:
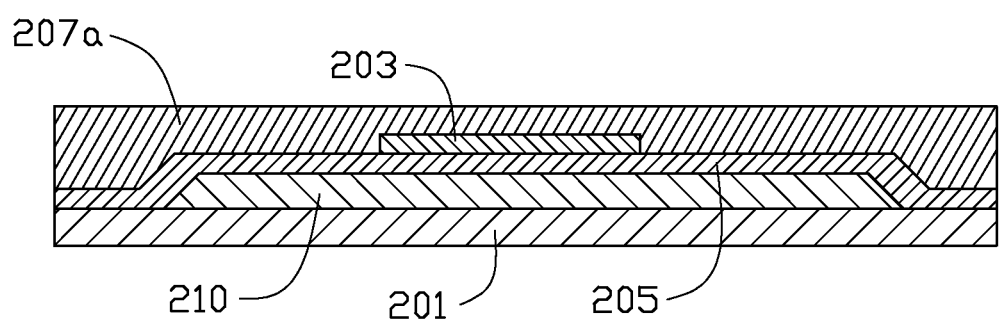
FIGS. 11-17 are sectional views illustrating a manufacturing method of the thin film transistor of FIG. 10.

At block 401, referring to FIG. 11, the gate electrode 210 and the gate insulating layer 205 are formed on the substrate 201. In detail, a first metal layer is deposited on the substrate 201, and then the first metal layer is patterned to form the gate electrode 210. The gate insulating layer 205 is coated on the gate electrode 210. In the embodiment, the first metal layer is etched by photo lithography process. The substrate 201 can be a glass substrate or a quartz substrate. The first metal layer can include molybdenum (Mo), aluminum (Al), chromium (Cr), copper (Cu), or neodymium (Nd). The gate insulating layer 205 can include silicon nitride (SiNx) or Silicon oxide (SiOx). In the embodiment, the gate insulating layer 205 can formed by sputtering, vacuum evaporation, pulsed laser deposition (PLD), or Plasma Enhanced CVD (PECVD) process.

At block 403, referring also to FIG. 11, the channel layer 203 is formed on the gate insulating layer 205 to correspond to the gate electrode 210, and the organic stop layer 207a is coated on the channel layer 203. The channel layer 103 can be metal oxide semiconductor, such as indium gallium zinc oxide (IGZO), zinc oxide (ZnO), indium oxide (InO), gallium oxide (GaO), or the like. In the embodiment, a metal oxide semiconductor layer is formed on the gate insulating layer 205 by sputtering, vacuum evaporation, pulsed laser deposition (PLD), or Plasma Enhanced CVD (PECVD) process, and then the metal semiconductor layer is patterned to form the channel layer 203. A material of the organic stop layer 207a is organic and transparent. In the embodiment, a photosensitivity of the organic stop layer 207a is not better than a photo-sensitivity of a photoresistor. The organic stop layer 207a protects the channel layer 203 against damage of subsequent processes, and a thickness of the organic stop layer 207a is one micrometer.

At block 405, the organic stop layer 207a is hard-baked to be flat and solid. Hard-baking the organic stop layer 207a enhances adhesion between the organic stop layer 207a and the channel layer 203. In the embodiment, the organic stop layer 207a is hard-baked between 100° C.-400° C. Residual organic solvents of the organic stop layer 207a is evaporated in the hard-baking, thus the organic stop layer 207a is solid and the adhesion between the etching stop layer and the channel layer 203 is enhanced.

Figure 12:
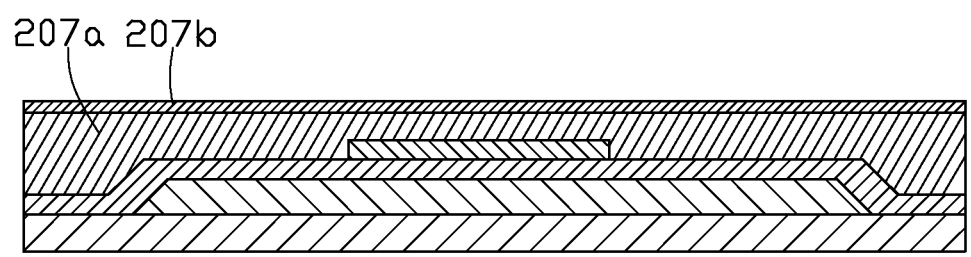

At block 407, referring to FIG. 12, the hard mask layer 207b is formed on the organic stop layer 207a. The hard mask layer 207b is stacked up with the organic stop layer 207a to form the etching stop layer 207. In the embodiment, a thickness of the hard mask layer 207b is less than a thickness of the organic stop layer 207a. The hard mask layer 207b can include silicon nitride (SiNx), Silicon oxide (SiOx), silicon fluorion (SiFx), or silicon nitride oxide (SiNxOy). In one embodiment, the hard mask layer 207b is formed by chemical vapor deposition (CVD) or sputtering process.

Figure 13:
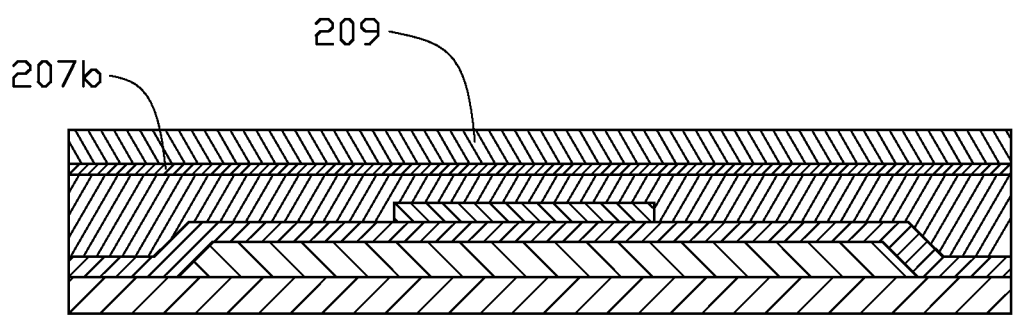

At block 409, referring to FIG. 13, a photoresistor layer 209 is coated on the etching stop layer 207.

Figure 14:
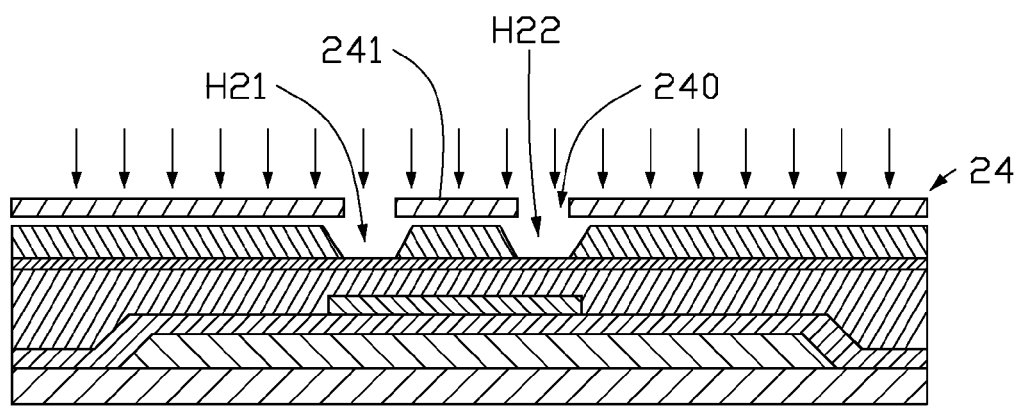

At block 411, referring to FIG. 14, the photoresistor layer 209 is patterned and two through holes H21 and H22 are defined on the patterned photoresistor layer 209. In detail, the photoresistor layer 209 is photo-exposed and developed to define the two through holes H21 and H22, under a shield of a photomask 24. A distance between the two through holes H21 and H22 is equal to a predetermined channel length. In the embodiment, the distance between the two through holes H21 and H22 is 3-5 micrometers. The photomask 24 can include two transmission portions 240 and a shading portion 241. A distance between the two transmission portions 240 defines the distance between the two through holes H21 and H22.

Figure 15:
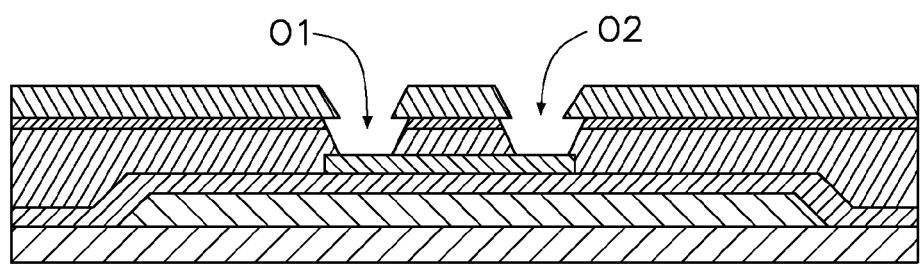

At block 413, referring to FIG. 15, two contact holes O21 and O22 are formed by etching the organic stop layer 207a and the hard mask layer 207b to the channel layer 207, with the patterned photoresistor layer 209 as a mask. The two contact holes O21 and O22 make respective contact with the two through holes H21 and H22. In the embodiment, the organic stop layer 207a and the hard mask layer 207b are etched by dry-etching method, such as plasma etching or reactive ion etching (RIE). A distance between the two contact holes O21 and O22 is substantially equal to the channel length L2.

Figure 16:
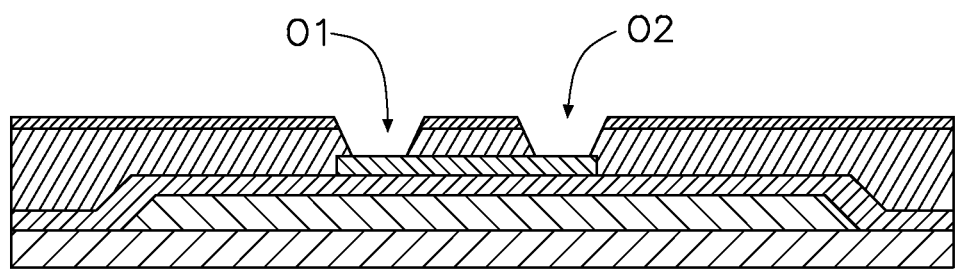

At block 415, referring to FIG. 16, residual photoresistor layer 209 is stripped away.

Figure 17:
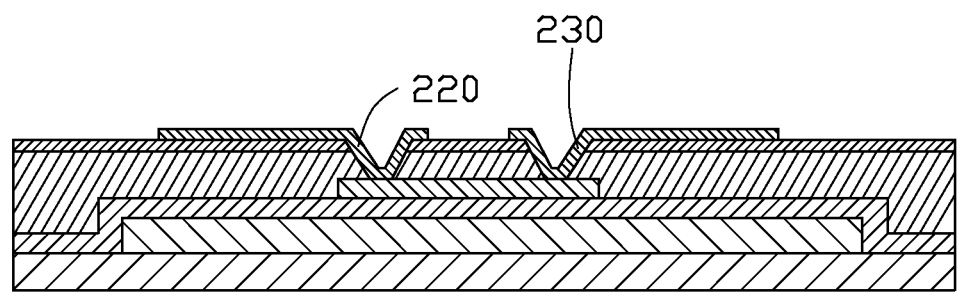
Figure 18:
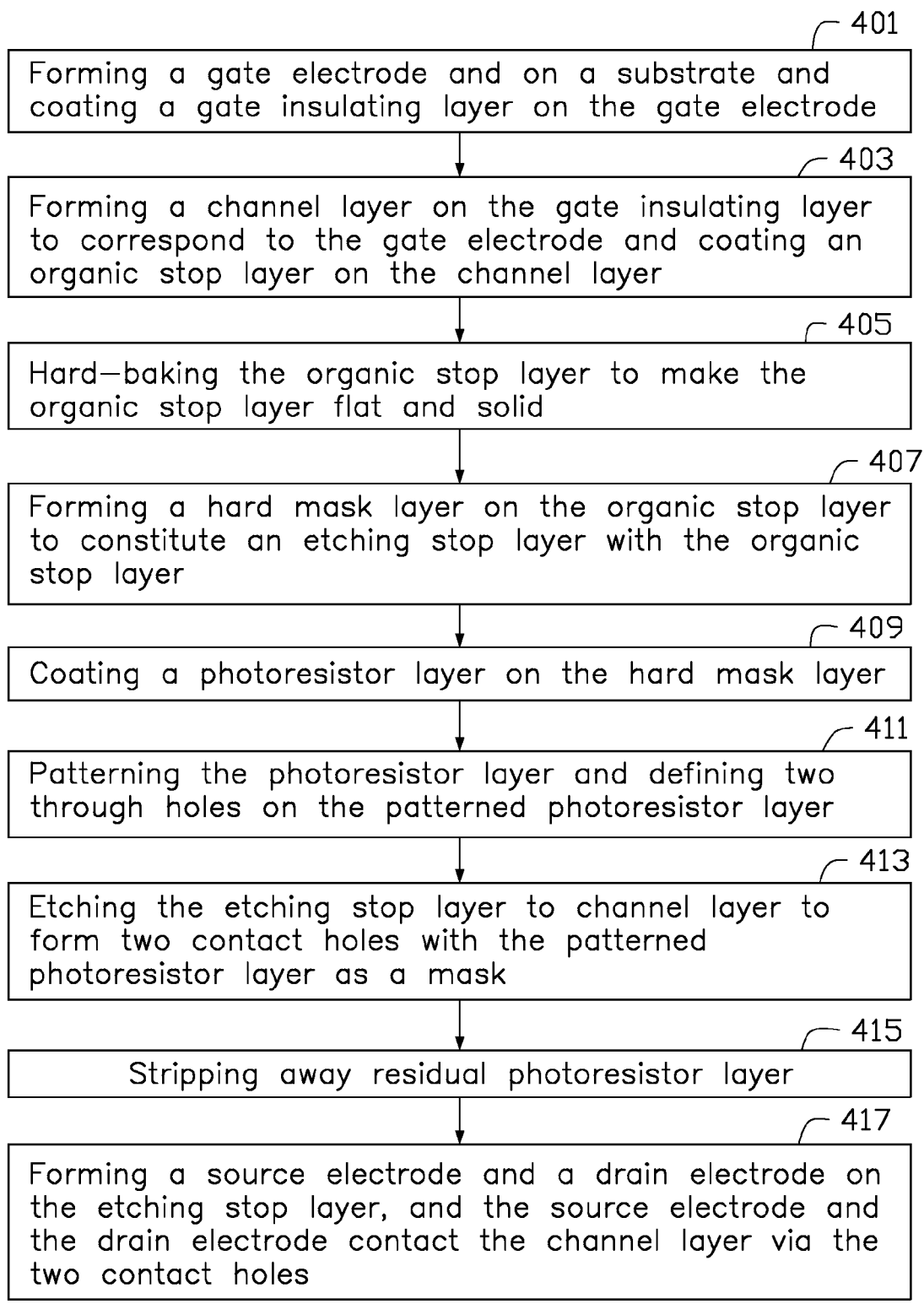
FIG. 18 is a flowchart of the manufacturing method of the thin film transistor of FIG. 10.

At block 417, referring to FIG. 17, the source electrode 220 and the drain electrode 230 are formed on the hard mask layer 207b. The source electrode 220 and the drain electrode 230 infill the two contact holes O21 and O22 to make contact with the channel layer 203. In detail, a second metal layer is deposited on the hard mask layer 207b, and then the source electrode 220 and the drain electrode 230 are formed in a mask process by patterning the second metal layer. The first metal layer can include molybdenum (Mo), aluminum (Al), chromium (Cr), copper (Cu), or neodymium (Nd).

When the thin film transistors 100 and 200 are applied to a liquid crystal display panel by a subsequent process, a planar layer and pixel structure will be formed.

In summary, a manufacturing method of the thin film transistor includes hard-baking and etching a stop layer, and two through holes are exposed and developed in a photoresistor layer, the distance between the two through holes being substantially equal to the channel length of the thin film transistor. The etching stop layer is dry-etched to obtain the thin film transistor with an expected channel length.

It is to be understood that even though numerous characteristics and advantages of the present embodiments have been set forth in the foregoing description, with details of the structures and functions of the embodiments, the disclosure is illustrative only; and changes may be in detail, especially in the matter of arrangement of parts within the principles of the embodiments to the full extent indicated by the broad general meaning of the terms in which the appended claims are expressed.

What is claimed is:

1. A manufacturing method of a thin film transistor, the method comprising:
    forming a gate electrode on a substrate and coating a gate insulating layer on the gate electrode;
    forming a channel layer on the gate insulating layer, the channel layer corresponding to the gate electrode, coating an etching stop layer on the channel layer;
    causing the etching stop layer to be flat and solid by hard-baking the etching stop layer;
    coating a photoresist layer on the etching stop layer;
    patterning the photoresist layer and defining two through holes on the patterned photoresist layer;
    etching the etching stop layer to the channel layer to form two contact holes using the patterned photoresist layer as a mask;
    stripping away residual photoresist material from the photoresistor layer; and
    forming a source electrode and a drain electrode on the etching stop layer, wherein the source electrode and the drain electrode contact the channel layer via the two contact holes.

2. The manufacturing method of claim 1, wherein the etching stop layer is made of organic and transparent materials.

3. The manufacturing method of claim 1, wherein a photosensitivity of the photoresist layer is better than a photosensitivity of the etching stop layer.

4. The manufacturing method of claim 1, wherein the etching stop layer is hard-baked under a temperature condition between 100° C.-400° C.

5. The manufacturing method of claim 1, wherein a distance between the two through holes is less than ten micrometers.

6. The manufacturing method of claim 5, wherein the distance between the two through holes is 3-5 micrometers.

7. The manufacturing method of claim 1, further comprising providing a photomask having two transmission portions and a shading portion, and photo exposing and developing the photoresist layer to define the two through holes using the photomask.

8. The manufacturing method of claim 7, wherein a distance between the two transmission portions is defined to be the distance between the two through holes.

9. The manufacturing method of claim 1, wherein the etching stop layer is etched by a plasma etching method or a reactive ion etching (RIE) method.

10. The manufacturing method of claim 1, wherein the etching stop layer comprises an organic stop layer and a hard mask layer, the hard mask layer is located on a surface of the organic stop layer opposite to the substrate to enhance a hardness of the organic stop layer.

11. The manufacturing method of claim 10, wherein a photosensivity of the photoresist layer is better than a photosensivity of the organic stop layer.

12. The manufacturing method of claim 11, wherein a thickness of the hard mask layer is less than a thickness of the organic stop layer.

13. The manufacturing method of claim 11, wherein the hard mask layer comprises silicon nitride (SiNx), Silicon oxide (SiOx), silicon fluorion (SiFx), or silicon nitride oxide (SiNxOy).

14. A manufacturing method of a display array substrate, comprising:
    forming a plurality of thin film transistors on a substrate, wherein a method of manufacturing the thin film transistor comprises:
    forming a gate electrode on a substrate and coating a gate insulating layer on the gate electrode;
    forming a channel layer on the gate insulating layer, the channel layer corresponding to the gate electrode, forming an etching layer on the channel layer and coating the etching stop layer;
    causing the etching stop layer to be flat and solid by hard-baking the etching stop layer;
    coating a photoresist layer on the etching stop layer;
    patterning the photoresist layer and defining two through holes on the patterned photoresist layer;

etching the etching stop layer to the channel layer to form two contact holes using the patterned photoresist layer as a mask;

stripping away residual photoresist material from the photoresistor layer; and forming a source electrode and a drain electrode on the etching stop layer, wherein the source electrode and the drain electrode contact the channel layer via the two contact holes.

15. The manufacturing method of claim 14, wherein a material of the etching stop layer is organic and transparent and a photosensivity of the photoresist layer is better than a photosensitivity of the etching stop layer.

16. The manufacturing method of claim 14, wherein the etching stop layer is hard-baked under a temperature condition between 100° C.-400° C., and a distance between the two through holes is less than ten micrometers.

17. The manufacturing method of claim 16, wherein the distance between the two through holes is 3-5 micrometers.

18. The manufacturing method of claim 14, further comprising providing a photomask having two transmission portions and a shading portion, and photo exposing and developing the photoresist layer to define the two through holes using photomask.

19. The manufacturing method of claim 18, wherein a distance between the two transmission portions defines the distance between the two through holes.

20. The manufacturing method of claim 14, wherein the etching stop layer comprises an organic stop layer and a hard mask layer, the hard mask layer is located on a surface of the organic stop layer opposite to the substrate to enhance a hardness of the organic stop layer.

\* \* \* \* \*